United States Patent [19]

Beale et al.

[11] Patent Number: 4,581,545
[45] Date of Patent: Apr. 8, 1986

[54] SCHMITT TRIGGER CIRCUIT

[75] Inventors: Richard G. Beale, Freehold, N.J.; Apparajan Ganesan, Indianapolis, Ind.

[73] Assignees: AT&T Technologies; AT&T Bell Laboratories, both of Murray Hill, N.J. ; a part interest

[21] Appl. No.: 538,945

[22] Filed: Oct. 4, 1983

[51] Int. Cl.[4] .......................................... H03K 3/295
[52] U.S. Cl. ................................. 307/290; 307/297; 307/279; 307/359; 307/496
[58] Field of Search ............... 307/451, 452, 358, 359, 307/362, 363, 272 R, 279, 290, 297, 296 R, 494, 496, 497, 500, 501

[56] References Cited

U.S. PATENT DOCUMENTS

| | | | |
|---|---|---|---|
| 4,110,641 | 8/1978 | Payne | 307/279 X |
| 4,359,649 | 11/1982 | Mündel | 307/290 |
| 4,394,587 | 7/1983 | McKenzie et al. | 307/362 X |
| 4,419,594 | 12/1983 | Gemmell et al. | 307/501 X |
| 4,430,582 | 2/1984 | Bose et al. | 307/491 X |
| 4,438,349 | 3/1984 | Shoji | 307/359 X |
| 4,456,840 | 6/1984 | Ide et al. | 307/359 X |
| 4,464,581 | 8/1984 | Oritani | 307/497 X |
| 4,464,588 | 8/1984 | Wieser | 307/496 X |

*Primary Examiner*—Stanley D. Miller
*Assistant Examiner*—D. R. Hudspeth
*Attorney, Agent, or Firm*—Volker R. Ulbrich

[57] ABSTRACT

A Schmitt trigger circuit 10 includes a pair of transmission gates 20, 22 connected, respectively, between a pair of threshold voltages $V_{tH}$, $V_{tL}$ and the threshold input port 16 of a comparator 12. The control lead of one transmission gate 20 is connected to the output 18 of the comparator 12 through an inverter 24. The control lead of the other transmission gate 22 is connected directly to the output 18 of the comparator 12. The other input port 14 of the comparator 12 receives the signal input. Also disclosed is a circuit 26 for generating the reference voltages $V_{tH}$, $V_{tL}$. The circuit 26 includes an operational amplifier 28 driving a complementary pair of current mirrors (M1, M3, M5; M4, M6) which force current through a pair of resistors ($R_H$, $R_L$) to ground potential. The resistors ($R_H$, $R_L$) provide stable reference potentials.

6 Claims, 2 Drawing Figures

SCHMITT TRIGGER CIRCUIT

BACKGROUND OF THE INVENTION

This invention relates generally to Schmitt trigger circuits and more particularly to such circuits especially suited for CMOS (complementary metal-oxide-semicondoctor) integrated circuits.

A Schmitt trigger, also called a Schmitt limiter, is a bistable pulse generator circuit in which an output voltage undergoes a level transition with hysteresis in response to a changing input voltage. That is, the output voltage undergoes one level transition when the signal voltage rises to a high threshold voltage $V_{th}$, and undergoes another, opposite level transition when the input signal voltage drops to a lower threshold voltage $V_{tL}$. The difference between the two thresholds voltages ($V_{th} - V_{tL}$) is the "Schmitt width" and determines the amount of hysteresis of the trigger. Such triggers are used extensively wherever analog circuits interface with digital circuits. It is desirable that they be located with the digital circuit in the same integrated circuit. As a practical matter, this means that they are likely to be in CMOS technology.

One problem with present Schmitt trigger circuits is that typically the input threshold voltages and hysteresis are interdependent and are susceptible to changes in their values as a result of variations in the processing of the circuit in which they are incorporated. Means for compensating for such changes add considerably to the complexity of the circuit.

SUMMARY OF THE INVENTION

The novel Schmitt trigger in accordance with the present inveniton is designed so that the output of a comparator controls a pair of electronic switches which selectively connects the threshold input of the comparator to one or the other of a pair of reference voltages. The threshold voltages may be independently determined by a reference voltage and device geometry ratios. This results in an accurate hysteresis. Also, since there is no switching of current involved in the Schmitt trigger operation, the circuit can operate at a higher speed.

The reference voltages which determine the thresholds of the circuit are generated in a network with a constant current. Since the switches which selectively connect the reference voltages to the input of the comparator do not themselves carry any steady state current, their ON resistance is not a significant factor, and any process variations in their ON resistance do not adversely affect the operation of the trigger circuit. The amount of hysteresis, the accuracy of the hysteresis threshold levels, and their independence are unaffected by the external loading at the input or output.

DDETAILED DESCRIPTION

Figure 1:
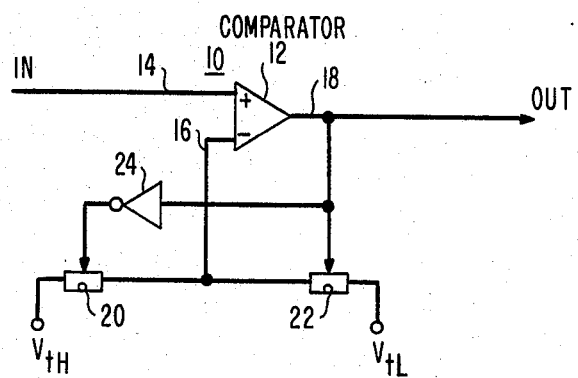
FIG. 1 is a simplified functional schematic circuit diagram of a Schmitt trigger circuit in accordance with one embodiment of the present invention.

The Schmitt trigger 10 shown in FIG. 1 of the drawing includes a high speed comparator 12 with a noninverting input port connected as a signal input port 14, an inverting input port connected as a threshold voltage input port 16, and an output port 18. The threshold voltage port 16 is connected to a high threshold voltage $V_{tH}$ through a first transmission gate 20 and to a low threshold voltage $V_{tL}$ through a second transmission gate 22. The transmission gates 20, 22 are operated in response to the output voltage level of the high speed comparator 12. The control input of the first gate 20 is connected to the output port 18 of the comparator 12 through an inverter 24, while the control input of the second gate 22 is connected to the output port 18 directly. The transmission gates 20, 22 are preferably a parallel complementary pair of MOS (metal-oxide-semiconductor) transistors so arranged to minimize switching charge feedthrough. The gate of the N-channel transistor of the pair is tied directly to the control input lead, while the gate of the P-channel transistor is connected to the control lead through an inverter which is incorporated in the transmission gate structure.

When the output of the comparator 12 is low, or OFF, the inverter 24 closes the transmission gate 20, so that the high threshold voltage $V_{tH}$ is connected to the threshold input port 16. When the signal voltage at the signal input port 14 exceeds this voltage, the output of the comparator 12 switches to its hgh, ON output level. This turns off the first transmission gate 20 and turns on the second gate 22, so that the low threshold voltage $V_{tL}$ is now connected to the threshold voltage input port 16. Therefore, the output of the comparator 12 will remain ON until the input signal voltage level drops below the low threshold $V_{tL}$ level. Since the transmission gates 20, 22 are switching reference voltages, rather than currents, their ON resistance has no significant effect on the threshold voltages as seen by the comparator 12. Any process variations in the devices which make up the transmission gates 20, 22 will therefore not degrade the performance of the trigger 10.

Figure 2:
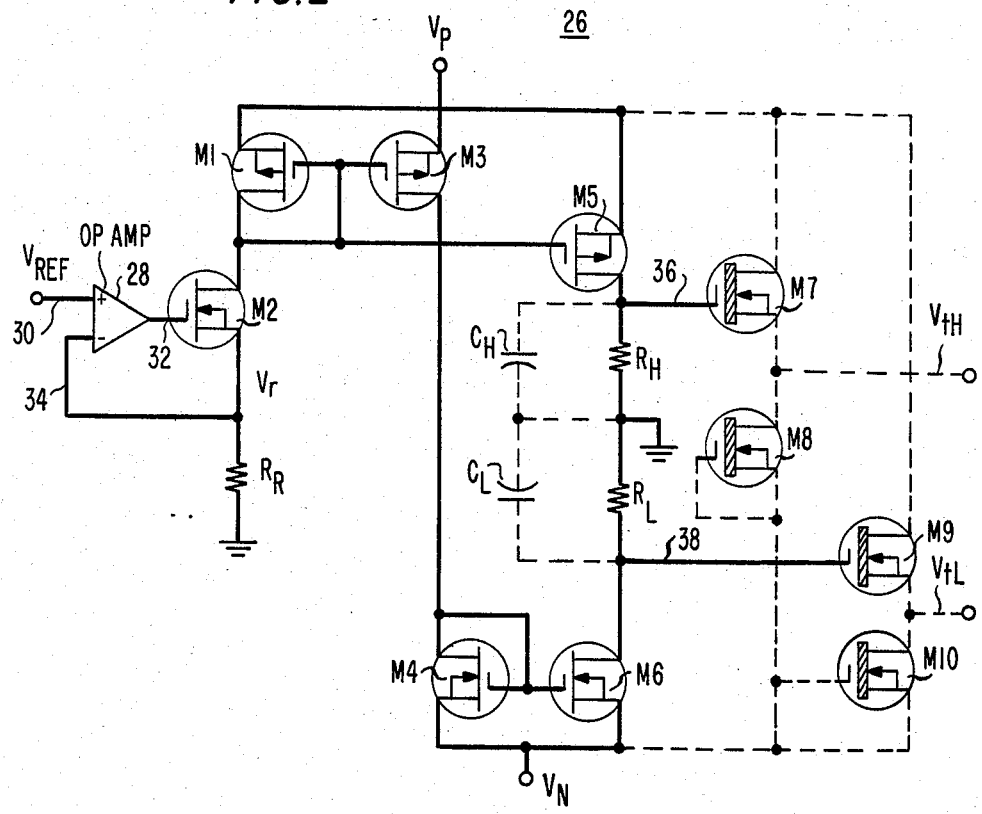
FIG. 2 is a schematic diagram of a circuit for generating the reference voltages which serve as the voltage thresholds for the circuit of FIG. 1.

FIG. 2 shows a circuit 26 for generating the reference voltages $V_{th}$, $V_{tL}$. The circuit 26 includes an operational amplifier 28 with its noninverting input port 30 connected to a reference voltage $V_{ref}$, which establishes a predetermined input voltage. Its output port 32 is connected to the gate of an N-type enhancement mode buffer transistor M2. The soruce of the transistor M2 is connected to the inverting input port 34 of the operational amplifier 28 and to signal ground potential through a current source resistor $R_R$. The drain of the transistor M2 is connected to the drain and gate of a P-type enhancement mode transistor M1 which has its source tied to a positive voltage supply rail $V_P$. Two additional P-type enhancement mode transistors M3, M5, which are identical to M1, also have their sources connected to the positive supply rail $V_p$. All three of the transistors M1, M3, M5 have common gates connected to the drain of M1. The drain of M3 is connected to the drain of an N-type enhancement mode transistor M4 which has its source tied to a negative voltage supply rail $V_N$. Another N-type enhancement mode transistor M6, which is identical to M4, also has its source connected to the negative supply rail $V_N$. The gates of both M4 and M6 are connected to the drain of M4. A pair of resistors $R_H$ and $R_L$ are connected in series between the drains of M5 and M6 with a common reference node. The drain of M5 provides a $V_{tH}$ output node 36, while the drain of M6 provides a $V_{tL}$ output node 38. These nodes 36, 38 are connected directly to the transmission gates 20, 22 as shown in FIG. 1.

It can be seen that the transistors M1 and M5 form a current mirror for the high threshold reference voltage $V_{tH}$. The transistor M3 mirrors current to the N-type transistor M4. The current through M1 results in corresponding equal currents through M3 and M5 by virtue of their common gate and source voltages. The transistors M4 and M6 likewise form a current mirror for the low threshold reference voltage $V_{tL}$. The currents through M4 and M6 are the same as those through M3 and M5, since the conduction paths of M3 and M4 are in series. Currents with a predetermined relationship therefore flow through the resistors $R_H$ and $R_L$. A particular value of $V_{tH}$ or $V_{tL}$ can be readily determined by appropriate choice of the resistance values of $R_H$ and $R_L$. It is noted that in the steady state the currents in the resistors $R_H$ and $R_L$ are constant and are unaffected by the switching of the transmission gates 20, 22, since they are being connected to the high impedance threshold voltage input port 16 of the comparator 12.

Under some circumstances it may be desirable to provide the circuit 26 with a buffer circuit to block voltage transients which might be introduced either by the switching of the transmission gates 20, 22 or by other equipment which may be associated with the trigger 10. One form of such protection is shown in phantom lines in FIG. 2. A pair of capacitors $C_H$, $C_L$ are connected in parallel, respectively, across the resistors $R_H$, $R_L$ for transient voltage suppression. The $V_{tH}$ output node is connected to the gate of an N-type depletion mode buffer transistor M7, which has its drain tied to the positive supply rail $V_p$ and its source connected to the negative supply rail $V_N$ through an active load device M8. The $V_{tL}$ output node is connected to the gate of an N-type depletion mode buffer transistor M9 which has its drain tied to the positive supply rail $V_P$ and its source connected to the negative supply rail $V_N$ through an active load device M10. The reference voltage node $V_{tH}$ is now at the source of the buffer M7, and the reference voltage node $V_{tL}$ is at the soruce of the buffer M9. The buffers M7 and M9 provide transient protection.

The invention can be implemented by comparators other than the high speed comparator 12 of the circuit 10. The circuit 10 may use an operational amplifier connected as a comparator. Moreover, it may use a comparator having a complementary output. In that case, the inverter 24 is not necessary, since the transmission gates 20, 22 will then be operated directly from the respective separate outputs.

Although in the trigger 10 of FIG. 1 the transmission gates 20, 22 operate without provision for break-before-make, the circuit may be modified in known ways for operation without overlap. This can be accomplished, for example, by the provision of a suitable latching device or other control interface between the output port 18 of the comparator 12 and the control input of one or both of the transmission gates 20, 22.

The reference voltage $V_{ref}$ for the operational amplifier 28 of the circuit 26 of FIG. 2 may be conveniently provided by mismatching the differential input transistors of the operational amplifier 28 to create a well-defined offset voltage input. This establishes a set current in the conduction at path of the transistor M2 ot determine the threshold voltages $V_{tH}$ and $V_{tL}$.

While in the circuit 26 of FIG. 2, the resistors $R_H$ and $R_L$ have similar values and the transistors M1, M3, M4, M5 and M6 all have similar device geometries, it will be apparent to those skilled in the art that the threshold voltages $V_{tH}$ and $V_{tL}$ may also be determined by alternative arrangements in which the resistors have unequal values, as well as by arrangements in which the transistors M1, M3, M4, M5 and M6 have geometries appropriately scaled to provide current ratios other than unity.

The circuit 26 of FIG. 2 is realized in P-tub CMOS technology, in which the bulk regions of the P-channel transistors are tied to the positive rail $V_P$. The bulk regions of the N-channel transistors are tied to their soruces, but could also be at some other suitable voltage. The circuit 26 could likewise be realized in N-tube CMOS technology, with the bulk of the N-channel transistors then being tied to the negative supply rail $V_N$. The bulk of the P-channel transistors would be tied to their sources or to some other suitable voltage.

The circuit 26 can be readily redesigned by those skilled in the art to be in the form of a mirror image version with the transistor conduction channels having opposite conductivity type polarities. It may also be readily realized with bipolar transistors.

While the trigger 10 has transmission gates 20, 22 in the form of complementary transistor pairs, these may also be single transistors or other suitable electronic switches.

The trigger 10 of FIG. 1 may be modified so that the threshold voltages $V_{tH}$ and $V_{tL}$ are of the same polarity. This might be desirable, for example, for single power supply circuits. One way this might be accomplished is by means of an additional transistor and resistor connected in series between one of the power supply rails and signal ground potential, in parallel with either the transistor M5 and resistor $R_H$, or the transistor M6 and resistor $R_L$, depending upon which polarity is desired.

What is claimed is:

1. A trigger circuit, comprising:
   a comparator having a signal input port, a threshold voltage input port, and an output port;
   a first switch connected between the threshold voltage input port and a first threshold voltage node, the first switch being controlled to selectively connect the threshold voltage input port to the first threshold voltage node for establishing one output state of the comparator;
   a second switch connected between the threshold voltage input port and a second threshold voltage node, the second switch being controlled to selectively connect the threshold voltage input port to the second threshold voltage node for establishing another output state of the comparator.

2. The circuit defined in claim 1 wherein the first switch has a control lead connected to the output of the comparator through an inverter and the second switch has a control lead directly connected to the output of the comparator.

3. The circuit defined in claim 2 wherein the first and second switches comprise complementary transistor pairs connected as transmission gates.

4. The circuit defined in claim 3 including a threshold voltage source means connected to said first and second threshold voltage nodes comprising:
   a first field-effect transistor of one channel conductivity type and a second field-effect transistor of another channel conductivity type connected with their conduction paths in series, between a supply voltage node of one polarity and a first resistor which has its other side connected to a reference potential node;

an operational amplifier having an inverting input port connected to the common node of the second transistor and the first resistor, a non-inverting input port connected to a reference potential node, and an output connected to the gate of the second transistor;

a third field-effect transistor of the one channel conductivity type and a fourth field-effect transistor of the other channel conductivity type connected wtih their conduction paths in series, respectively, between the one polarity supply voltage node and an opposite polarity supply voltage node;

a fifth field-effect transistor of the one channel conductivity type having one side of its conduction path connected to the one polarity supply voltage node, the gates of the first, third, and fifth transistors all being connected to the common node of the first and second transistors;

a sixth field-effect transistor of the other channel conductivity type having one side of its conduction path connected to the other polarity supply voltage node, the gates of the fourth and sixth transistors being connected to the common node of the third and fourth transistors, and a second and a third resistor connected in series, respectively, between the other sides of the conduction paths of the fifth and sixth transistors and having their common node connected to a reference potential node, the common node of the fifth transistor and the second resistor forming one of said threshold voltage nodes and the common node of the sixth transistor and third resistor forming the other of said threshold voltage nodes.

5. The circuit defined in claim 4 comprising a transient suppression capacitor in parallel across each of the second and third resistors.

6. The circuit defined in claim 5 comprising buffered output means connected to at least one of the threshold voltage nodes.

* * * * *